US008254609B2

(12) United States Patent
Lin

(10) Patent No.: US 8,254,609 B2
(45) Date of Patent: Aug. 28, 2012

(54) MICROPHONES SHARING A COMMON ACOUSTIC PART AND VOLUME

(75) Inventor: Weili Lin, Plymouth, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 515 days.

(21) Appl. No.: 12/416,267

(22) Filed: Apr. 1, 2009

(65) Prior Publication Data

US 2009/0252365 A1 Oct. 8, 2009

Related U.S. Application Data

(60) Provisional application No. 61/041,808, filed on Apr. 2, 2008.

(51) Int. Cl.
*H01L 25/00* (2006.01)

(52) U.S. Cl. ........................................ 381/323; 381/369

(58) Field of Classification Search ........................ None
See application file for complete search history.

(56) References Cited

U.S. PATENT DOCUMENTS

| | | | |
|---|---|---|---|
| 2002/0110255 | A1 | 8/2002 | Killion et al. |
| 2004/0184630 | A1 | 9/2004 | Ach-Kowalewski et al. |
| 2008/0187157 | A1 | 8/2008 | Higgins |
| 2009/0010450 | A1 | 1/2009 | Burnett |

FOREIGN PATENT DOCUMENTS

| | | |
|---|---|---|
| EP | 1643798 | 4/2006 |
| EP | 1821570 A1 | 8/2007 |
| JP | 07104582 | 4/1995 |

OTHER PUBLICATIONS

"European Application Serial No. 09251027.0, Office Action mailed Dec. 14, 2009", 7 pgs.
"European Application Serial No. 09251027.0, Office Action mailed Jul. 16, 2010", 1 pg.
"European Application Serial No. 09251027.0, Office Action response filed Jan. 14, 2011", 17 pgs.

*Primary Examiner* — Alonzo Chambliss
(74) *Attorney, Agent, or Firm* — Schwegman, Lundberg & Woessner, P.A.

(57) ABSTRACT

The present subject matter provides method and apparatus for improved microphones sharing an acoustic volume. Some embodiments are useful for hearing assistance devices. Examples of an improved microphone module offering omni-directional and directional microphone capsules are provided. Different mounting and interconnection embodiments are provided. Different electrical connector embodiments are discussed. Improvements in space and performance, and other efficiencies, are provided by the teachings set forth herein.

19 Claims, 6 Drawing Sheets

MICROPHONES SHARING A COMMON ACOUSTIC PART AND VOLUME

CROSS-REFERENCE TO RELATED APPLICATIONS

The present application claims the benefit under 35 U.S.C. 119(e) of U.S. Provisional Patent Application Ser. No. 61/041,808, filed Apr. 2, 2008, which is incorporated herein by reference in its entirety.

FIELD OF THE INVENTION

The present subject matter relates to hearing assistance devices and in particular to method and apparatus for microphones sharing a common acoustic volume.

BACKGROUND

Hearing assistance devices are used to improve hearing for wearers. Such devices include, but are not limited to, hearing aids. Hearing assistance devices include microphones and electronics for processing the sound produced by the microphones. The processed sound signals are played to the wearer to provide improved hearing for the wearer.

The microphones of such devices are very important since they can enhance the sound picked up by the hearing assistance device and, in some cases, can reduce problems with room noise and acoustic feedback when used properly.

Devices which use multiple microphones oftentimes will use multiple omnidirectional microphones, or an omnidirectional microphone and a directional microphone. Each omnidirectional microphone requires at least one microphone port for reception of sound. Directional microphones require at least two microphone ports. The positioning and design of microphone ports and microphones in hearing assistance devices are complicated by space and performance limitations.

There is a need in the art for improved microphones. Such improved microphones should include enhanced space utilization and performance and should be easy to manufacture.

SUMMARY

The present subject matter provides method and apparatus for improved microphones sharing an acoustic volume. Some embodiments are useful for hearing assistance devices. Examples of an improved microphone module offering omnidirectional and directional microphone capsules are provided. Different mounting and interconnection embodiments are provided. Different electrical connector embodiments are discussed. Improvements in space and performance, and other efficiencies, are provided by the teachings set forth herein.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

In the various drawings, like numbered elements indicate same or similar components.

DETAILED DESCRIPTION

The following detailed description of the present subject matter refers to subject matter in the accompanying drawings which show, by way of illustration, specific aspects and embodiments in which the present subject matter may be practiced.

These embodiments are described in sufficient detail to enable those skilled in the art to practice the present subject matter. References to “an”, “one”, or “various” embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

Figure 1A:
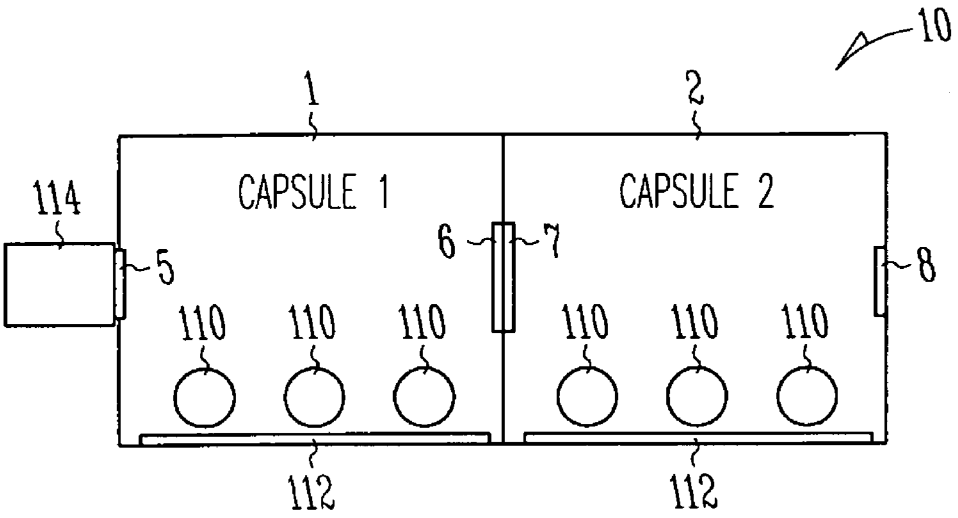
FIG. 1A is a diagram showing a top view of a microphone module including conjoined microphone capsules according to one embodiment of the present subject matter.

FIG. 1A is a diagram showing a top view of a microphone module including conjoined microphone capsules according to one embodiment of the present subject matter. Microphone module 10 includes a first microphone capsule 1 and a second microphone capsule 2. Microphone capsule 1 has a first opening 5 for reception of sound. It is designed to include a second opening 6 which will pass sound from the first capsule 1 to the second capsule 2. Capsule 2 has a first opening 7 which is aligned to receive sound from second opening 6. Sound enters into capsule 2 via first opening 5 and second opening 8. In various embodiments, when deriving the proportions of capsule 2, the sound chamber of capsule 1 is factored into the calculations. Thus, in various embodiments, both capsule 1 and capsule 2 are modified to provide a conjoined microphone 10 that demonstrates enhanced performance and form factor over separate microphones and over standard separate microphones that are acoustically coupled.

In various embodiments, capsule 1 includes a slit for second opening 6 and a slit for first opening 7. The slits are aligned and acoustically sealed together to provide effective sound transfer between capsule 1 and capsule 2. Various sealing methods may be employed, including, but not limited to, gluing the capsules together in proper alignment.

Rear port 114 is used to couple a sound opening on the hearing assistance device to the first opening 5. Slots 112 are used to mount the capsules 1 and 2 in a modular assembly. Solder pads 110 provide electrical contact points for the various microphones. These contacts can be soldered or connected via other connection techniques, such as connection via one or more flexible conductive tapes. One such technique includes the use of conductive silicone connections. Examples of conductive silicone connections include, but are not limited to, those provided in U.S. patent application Ser. No. 12/027,173 filed Feb. 6, 2008, entitled: ELECTRICAL CONTACTS USING CONDUCTIVE SILICONE IN HEARING ASSISTANCE DEVICES, the entire disclosure of which is hereby incorporated by reference in its entirety. Other contacts and connection methods are possible without departing from the scope of the present subject matter.

Various sizes are possible without departing from the scope of the present subject matter. For example, in various embodiments, Position 3 includes a slot in the case of 1.04×0.27 mm, Position W3 includes a slot in the case of 2×0.27 mm, Position W9 includes a slot in the case of 2×0.27 mm, and position 9T includes a hole in the case of diameter 0.5 mm. Other dimensions are possible without departing from the scope of the present subject matter.

Figure 1B:
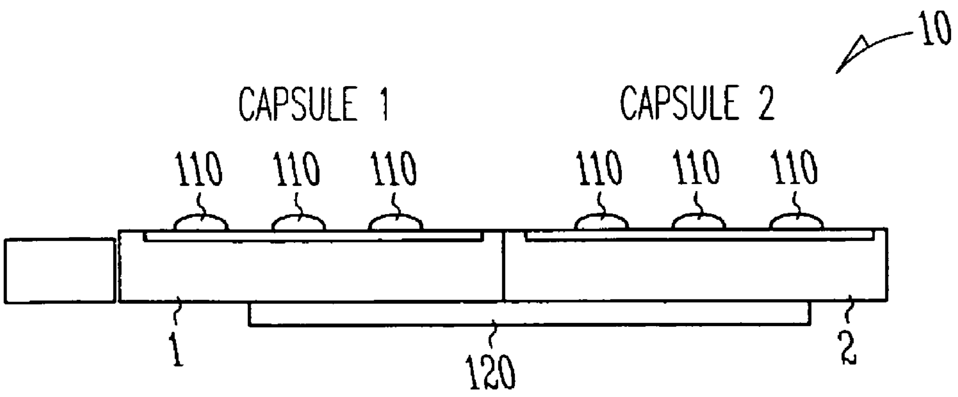
FIG. 1B is a diagram showing a side view of a microphone module including conjoined microphone capsules according to one embodiment of the present subject matter.

FIG. 1B is a diagram showing a side view of a microphone module including conjoined microphone capsules according to one embodiment of the present subject matter. A connection plate 120 is used to connect the first and second capsule together. In one embodiment, the connection plate is about 4.8×2.3×0.14 mm. Other dimensions and shapes of connection plates are possible without departing from the scope of the present subject matter.

It is understood that the microphone modules of FIGS. 1A and 1B are intended to demonstrate one geometry and configuration. Other geometries and configurations are possible without departing from the scope of the present subject matter. For example, in various embodiments an omnidirectional-omnidirectional microphone capsule combination is used. In various embodiments, a directional-directional microphone capsule combination is used. In various embodiments, an omnidirectional-directional microphone capsule combination is used. In various embodiments, the order of the directional and omnidirectional microphones is reversed. As another example, it is possible to use geometries which are not standard. Other variations are possible without departing from the scope of the present subject matter.

Figure 1C:
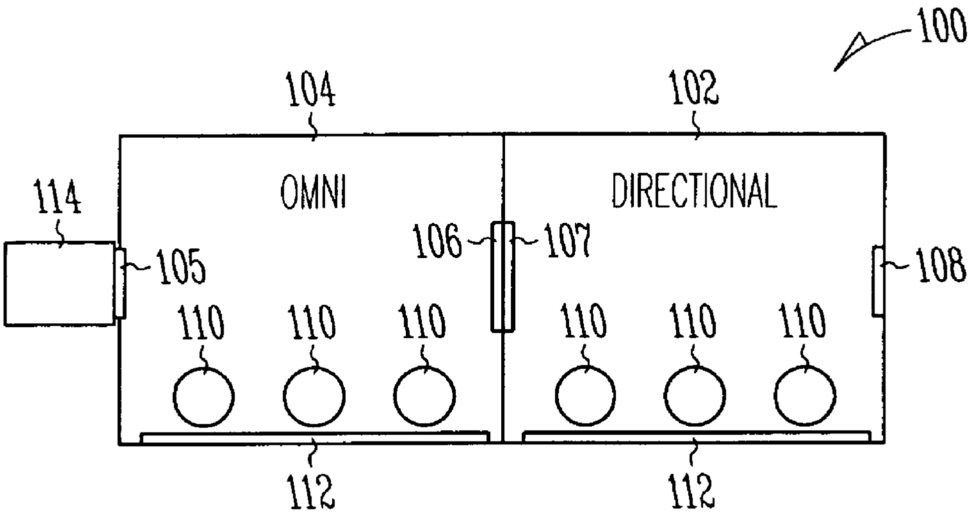
FIG. 1C is a diagram showing a top view of a microphone module including conjoined omnidirectional and directional microphones according to one embodiment of the present subject matter.

FIG. 1C is a diagram showing a top view of a microphone module including conjoined omnidirectional and directional microphones according to one embodiment of the present subject matter. Microphone module 100 includes a directional capsule 102 and an omnidirectional capsule 104. Omnidirectional microphone capsule 104 has a first omni opening 105 for reception of sound. It is modified to include a second omni opening 106 which will pass sound from the omnidirectional capsule 104 to directional capsule 102. Directional capsule 102 in turn has a first directional opening 107 which is aligned to receive sound from second omni opening 106. Sound enters into directional capsule 102 via first omni opening 105 and second directional opening 108 and provides a directional output signal indicative of the sound received at both openings. In various embodiments, when deriving the proportions of directional capsule 102, the sound chamber of omnidirectional capsule 104 is factored into the calculations. Thus, in various embodiments, both omnidirectional capsule 104 and directional capsule 102 are modified to provide a conjoined microphone 100 that demonstrates enhanced performance over separate microphones and over standard separate microphones that are acoustically coupled.

In various embodiments, omnidirectional capsule 104 includes a slit for second omni opening 106 and a slit for first directional opening 107. The slits are aligned and acoustically sealed together to provide effective sound transfer from the omnidirectional microphone to the directional microphone. In such embodiments, it is possible to calculate the dimensions of the directional microphone to include the sound volume of the omnidirectional microphone. Such designs provide a compact and efficient conjoined microphone assembly. Various sealing methods may be employed, including, but not limited to, gluing the capsules together in proper alignment.

Rear port 114 is used to couple a sound opening on the hearing assistance device to the first omni opening 105. Rear port 114 is depicted as a large diameter spout. It is understood that the diameter of the spout providing sound to the omnidirectional microphone is also adapted to provide sufficient sound to the directional microphone via the omnidirectional microphone. Thus, the second directional opening 108 may be of smaller size in various embodiments.

Slots 112 are used to mount the capsules 102, 104 in a modular assembly. Solder pads 110 provide electrical contact points for the various microphones. These contacts can be soldered or connected via other connection techniques, such as connection via one or more flexible conductive tapes. One such technique includes the use of conductive silicone connections. Examples of conductive silicone connections include, but are not limited to, those provided in U.S. patent application Ser. No. 12/027,173 filed Feb. 6, 2008, entitled: ELECTRICAL CONTACTS USING CONDUCTIVE SILICONE IN HEARING ASSISTANCE DEVICES, the entire disclosure of which is hereby incorporated by reference in its entirety. Other contacts and connection methods are possible without departing from the scope of the present subject matter.

Various sizes are possible without departing from the scope of the present subject matter. For example, in various embodiments, Position 3 includes a slot in the case of 1.04×0.27 mm, Position W3 includes a slot in the case of 2×0.27 mm, Position W9 includes a slot in the case of 2×0.27 mm, and position 9T includes a hole in the case of diameter 0.5 mm. Other dimensions are possible without departing from the scope of the present subject matter.

Figure 1D:
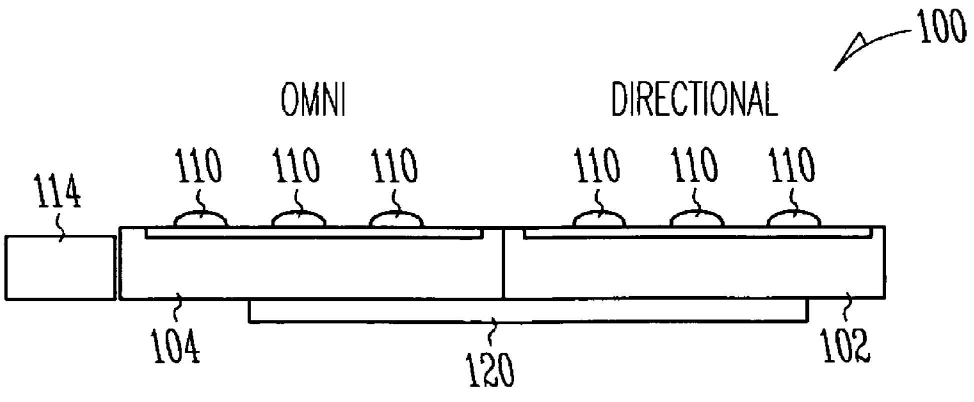
FIG. 1D is a diagram showing a side view of a microphone module including conjoined omnidirectional and directional microphones according to one embodiment of the present subject matter.

FIG. 1D is a diagram showing a side view of a microphone module including conjoined omnidirectional and directional microphones according to one embodiment of the present subject matter. A connection plate 120 is used to connect the first and second capsules together. In one embodiment, the connection plate is about 4.8×2.3×0.14 mm. Other dimensions and shapes of connection plates are possible without departing from the scope of the present subject matter.

It is understood that the microphone modules of FIGS. 1A to 1D are intended to demonstrate one geometry and configuration. Other geometries and configurations are possible without departing from the scope of the present subject matter. Other variations are possible without departing from the scope of the present subject matter.

Figure 2:
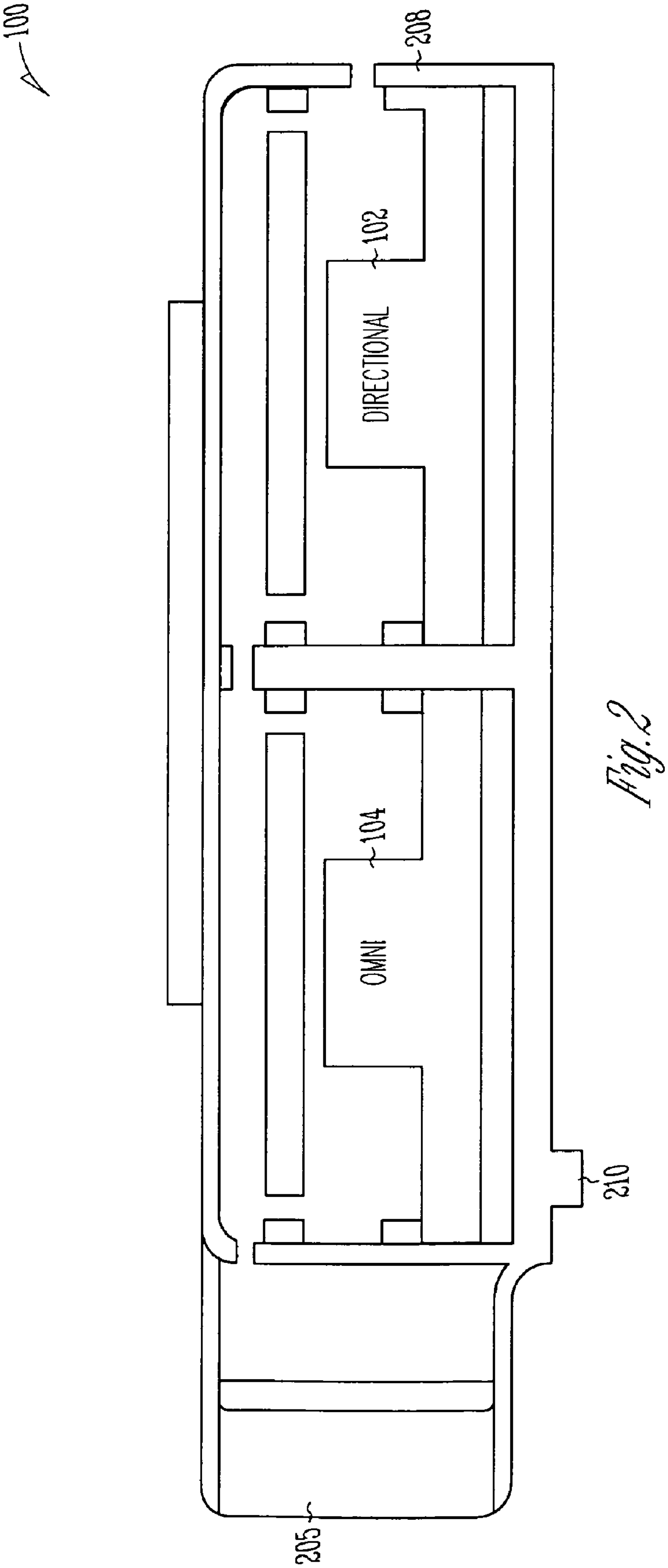
FIG. 2 is a perspective cutaway view of a design for a conjoined microphone module according to one embodiment of the present subject matter.

FIG. 2 is a perspective cutaway view of a design for a conjoined microphone module according to one embodiment of the present subject matter. Conjoined microphone 200 includes an omnidirectional capsule 104 connected to a directional capsule 102, in various embodiments as set forth herein. The module is packaged to include a rear port 205 and a front port 208. The design of FIG. 2 is depicted as a surface mount hybrid module, which has contacts 210 showing on the lower surface. In various embodiments, contacts 210 are connected to solder pads 110 in various combinations to provide interconnections to the various capsules of the module. In various embodiments to conserve space and provide maximum reception power, the dimensions of the sound chamber for the directional microphone can use the dimensions of the sound chamber of the omnidirectional microphone. The resulting compact design is efficient in terms of space and power and provides ease of manufacturing and assembly since only two sound ports are required to be acoustically connected to the resulting hearing assistance device. It is understood that a variety of connections can be employed to the module, and that it is not limited to surface mounting.

Figure 3:
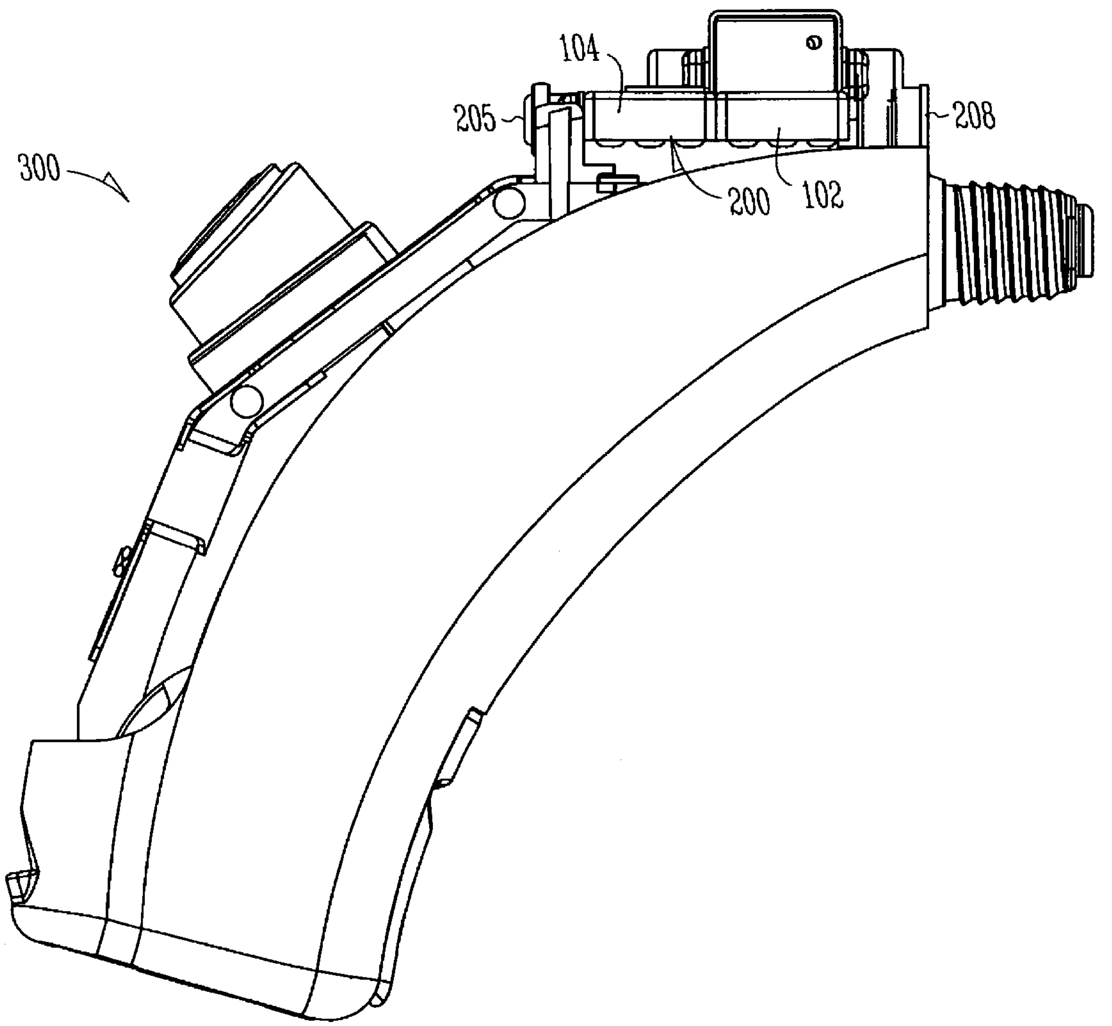
FIG. 3 is a cutaway view of the behind-the-ear portion of a hearing assistance device using the microphone module of FIG. 2, according to one embodiment of the present subject matter.

FIG. 3 is a cutaway view of the behind-the-ear portion of a hearing assistance device using the microphone module of FIG. 2, according to one embodiment of the present subject matter. In the example shown, microphone module 200 is shown mounted in a behind-the-ear hearing assistance device 300. It is understood that this device is used to demonstrate the use of the microphone module, and that other devices are possible without departing from the scope of the present subject matter. For example, the microphone module of the present subject matter could be mounted in a behind-the-ear component of a receiver-in-canal (RIC) type device. As another example, the microphone module of the present subject matter could be mounted in an over-the-ear or on-the-ear component of a hearing assistance device.

One advantage of the design of FIG. 3 is that only two microphone ports 205 and 208 need to be connected to openings in the case of BTE 300, thereby simplifying design and assembly. The contacts 210 (not shown) can be connected by any of the connection methodologies set forth herein and including those that are known in the art. Another advantage of the design of FIG. 3 is that the microphone module can be assembled in a substantially lower profile than previous designs. Other advantages exist that are not expressly set forth herein.

Figure 4A:
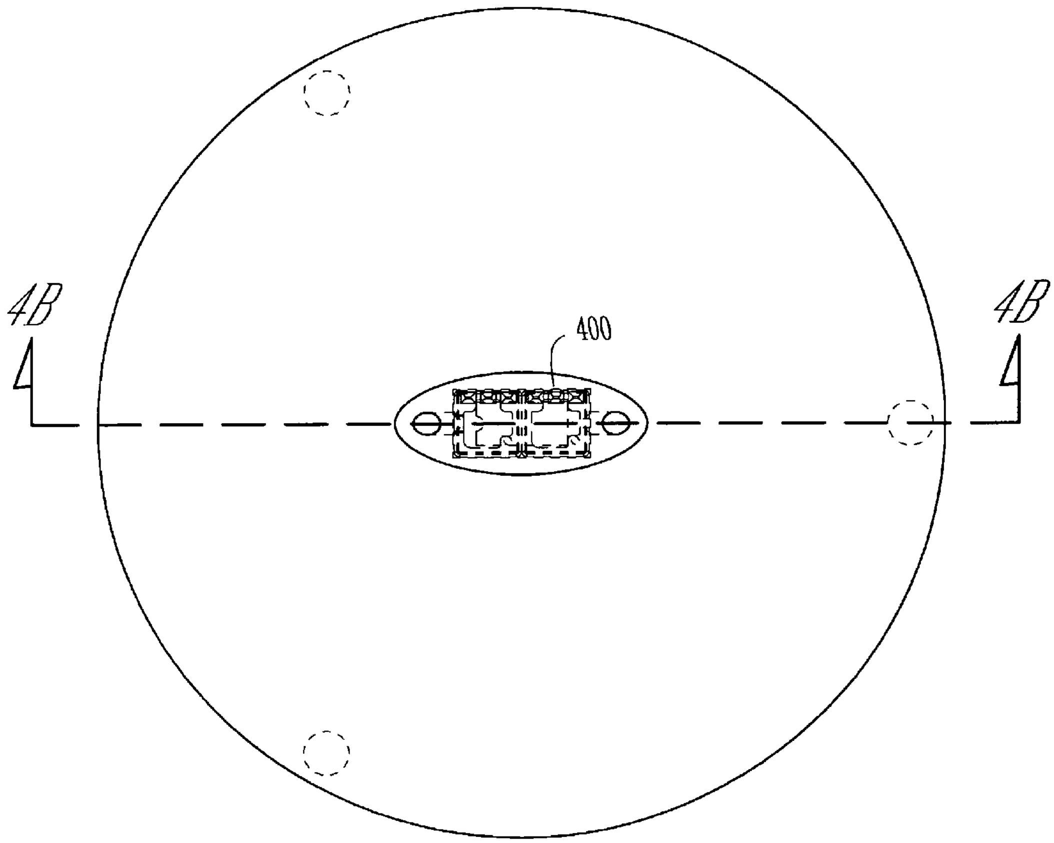
FIGS. 4A and 4B show different views of an in-the-ear faceplate using a microphone module according to one embodiment of the present subject matter.
Figure 4B:
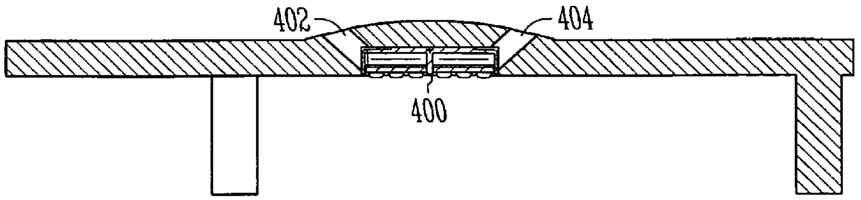

The present subject matter can be used in in-the-ear designs. FIGS. 4A and 4B show different views of an in-the-ear (ITE) faceplate using a microphone module according to one embodiment of the present subject matter. FIG. 4A is a plan or top view of one example of an ITE faceplate including a microphone module 400. FIG. 4B is a cross section showing at least two sound ports 402 and 404 configured into the faceplate to acoustically connect to the ports of the microphone module 400. Other configurations of sound ports and numbers of ports are possible without departing from the scope of the present subject matter.

Figure 5:
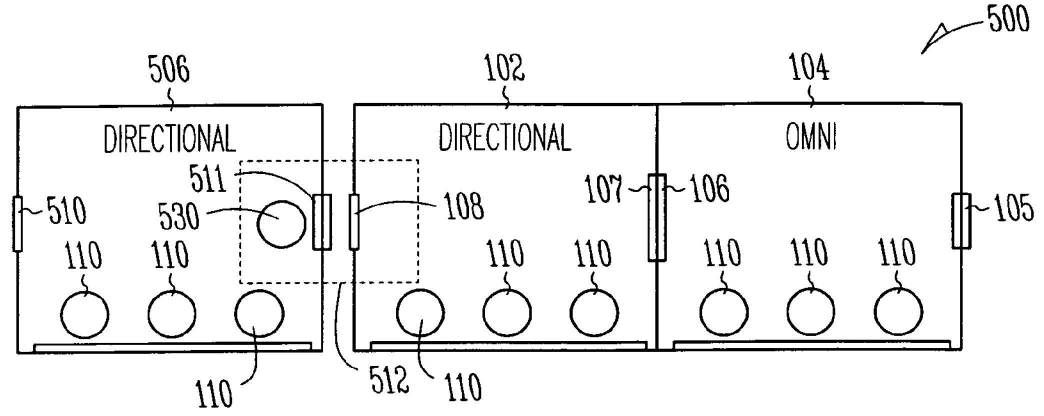
FIG. 5 is a block diagram of a second order microphone module according to one embodiment of the present subject matter.

FIG. 5 is a block diagram of a second order microphone module 500 according to one embodiment of the present subject matter. The discussion above for omni capsule 104 and directional capsule 102 is incorporated herein by reference. In the present example, another directional microphone, directional microphone capsule 506 is added to the design of FIG. 1 to create a second order microphone module 500. The second directional opening 108 of directional capsule 102 is connected to a third port 530. The second directional opening 511 of directional capsule 506 is also connected to third port 530. These ports are connected in an acoustically sealed fashion, as is depicted by sealed area 512. Thus, the resulting microphone module has three acoustic ports 510, 105, and 530. Electrical pads 110 are used to connect to each microphone. As demonstrated herein, these pads may be combined to common contacts where appropriate in hybrid packaging and connected as described herein. Various slots or other mounting assemblies may be employed to place the modules within an assembly.

Figure 6:
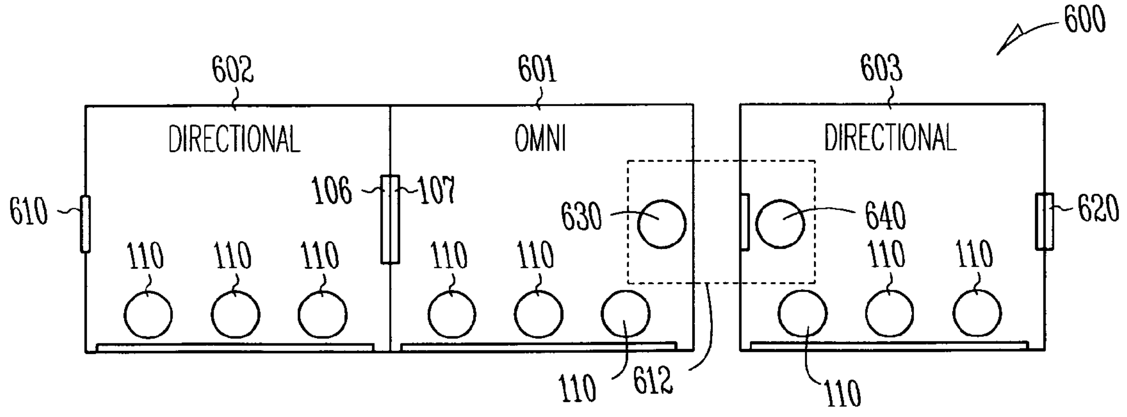
FIG. 6 is a block diagram of a second order microphone module according to one embodiment of the present subject matter.

FIG. 6 is a block diagram of a second order microphone module 600 according to one embodiment of the present subject matter. It provides a variation of the design 500 of FIG. 5 for purposes of demonstration. In microphone assembly 600 the order of the microphones is varied to provide an omni capsule 601 situated between a first directional microphone capsule 602 and a second directional microphone capsule 603. The sealed area 612 provides for an acoustic input port 630 for modules 601 and 603. Thus, this design has three acoustic ports 610, 620, and 630. Electrical pads 110 are used to connect to each microphone. As demonstrated herein, these pads may be combined to common contacts where appropriate in hybrid packaging and connected as described herein. Various slots or other mounting assemblies may be employed to place the modules within an assembly.

It is understood that higher order microphones can be constructed using various combinations of omnidirectional and/or directional microphone capsules. Thus, the examples given herein are intended to be demonstrative and not exclusive or limiting.

It is understood that the position of acoustic ports may vary without departing from the scope of the present subject matter. In various embodiments, the acoustic ports 530 and 630 can be located in different positions relative to the other ports to achieve different port spacings, as may be desirable in different designs. This is demonstrated as port 640 in FIG. 6. Port 640 provides an alternative to port 630 in that it provides an acoustic port closer to port 620 where such applications are beneficial. Other port positions are possible without departing from the scope of the present subject matter.

The present microphone module may employ a dual diaphragm that shares one or more volumes and/or one or more acoustic openings. Such designs are less prone to degradation in directional performance from exposure to demanding environments such as elevated temperatures and high humidities. Such designs offer lower overall noise than dual-omni systems due to the involvement of only one microphone and one input circuit stage in such embodiments. Overall design is more straightforward because there are fewer acoustic coupling areas between the microphone module and the hearing assistance device. A lower profile design is possible which is more cosmetically appealing.

For a first order directional system, equivalent input noise (EIN) is inversely proportional to the logarithm of the spacing between its front and rear ports. By including the omnidirectional microphone as part of the directional system, the port spacing of the directional microphone is effectively doubled, which can provide substantial improvements in EIN performance. In certain embodiments it is possible to achieve 6 dB improvements in EIN performance.

In embodiments which shadow one volume of the directional microphone, the omnidirectional microphone may function as a buffer to provide more stable directional performance and a design which is less susceptible to hazardous environments, such as high humidity, sweat, and wind.

As demonstrated herein, in addition to the first order systems described herein, higher order directional modules can be constructed using the teachings provided herein. Such designs may employ one or more additional matched differential microphones. Such systems have benefits over multiple omnidirectional microphone designs, including, but not limited to: fewer microphones are required, less microphone matchings are necessary, performance is more stable as discussed herein, lower system EIN, simpler algorithm designs can be employed, and potentially lower overall costs can be met.

The present subject matter includes hearing assistance devices, including but not limited to, cochlear implant type hearing devices, hearing aids, such as behind-the-ear (BTE), in-the-ear (ITE), in-the-canal (ITC), or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user. It is understood that other hearing assistance devices not expressly stated herein may fall within the scope of the present subject matter.

It is understood one of skill in the art, upon reading and understanding the present application will appreciate that variations of order, information or connections are possible without departing from the present teachings. This application is intended to cover adaptations or variations of the present subject matter. It is to be understood that the above description is intended to be illustrative, and not restrictive. The scope of the present subject matter should be determined with reference to the appended claims, along with the full scope of equivalents to which such claims are entitled.

What is claimed is:

1. A microphone module, comprising:

a plurality of connected microphone capsules, including a first microphone capsule and a second microphone capsule, wherein at least the first and second microphone capsules share an acoustic port and a common acoustic volume;

a connection plate for mounting the first and second microphone capsules;

solder pads for each of the plurality of microphone modules that are placed on one side of the microphone module; and slots for mounting each of the plurality of microphone modules in an assembly.

2. The microphone module of claim 1, wherein the first microphone capsule is a directional microphone capsule and the second microphone capsule is an omnidirectional microphone capsule.

3. The microphone module of claim 1, wherein the first and second microphone capsules are directional microphone capsules.

4. The microphone module of claim 1, wherein the first and second microphone capsules are omnidirectional microphone capsules.

5. The microphone module of claim 1, wherein the first and second microphone capsules are mounted on a connection plate.

6. The microphone module of claim 1, further comprising solder pads for each of the plurality of microphone modules that are placed on one side of the microphone module.

7. The microphone module of claim 1, further comprising flexible conductive tape connectors for connecting the plurality of microphone modules.

8. The microphone module of claim 1, further comprising conductive silicone connections for connecting the plurality of microphone modules.

9. The microphone module of claim 1, further comprising slots for mounting each of the plurality of microphone modules in an assembly.

10. The microphone module of claim 1, further comprising a third microphone module connected to the first microphone module via a sealed area having a separate acoustic port.

11. The microphone module of claim 1, further comprising conductive silicone connections for connecting the plurality of microphone modules.

12. The microphone module of claim 1, further comprising a third microphone module connected to the first microphone module via a sealed area having a separate acoustic port.

13. A method of making a microphone module, comprising:

aligning an opening of a first microphone module to an opening of a second microphone module; and sealing the aligned first microphone module and the second microphone module in alignment, such that the first and second microphone modules share a common acoustic volume.

14. The method of claim 13, wherein the sealing includes gluing.

15. The method of claim 13, wherein the aligning includes using slots or other mounting assemblies for aligning.

16. The method of claim 13, further comprising making electrical connections to one or more of the first and second microphone modules using conductive silicone connections, conductive flexible tape, or combinations thereof.

17. The method of claim 13, further comprising attaching a third microphone module to the first microphone module via a sealed area having a separate acoustic port.

18. The method of claim 17, further comprising making electrical connections to one or more of the first, second, and third microphone modules using conductive silicone connections.

19. The method of claim 17, further comprising making electrical connections to one or more of the first, second, and third microphone modules using flexible conductive tape.

* * * * *